United States Patent [19]
Saifi

[11] 3,993,967
[45] Nov. 23, 1976

[54] RESISTANCE-CAPACITANCE NETWORK

[75] Inventor: Mansoor Ali Saifi, East Windsor, N.J.

[73] Assignee: Western Electric Company, Inc., New York, N.Y.

[22] Filed: Mar. 31, 1975

[21] Appl. No.: 563,905

[52] U.S. Cl. .................. 333/70 CR; 317/256; 317/260; 333/70S; 333/79
[51] Int. Cl.² .................. H03H 7/06; H01G 4/40; H01G 4/32
[58] Field of Search .......... 333/79, 70 CR, 29, 70 S; 317/256, 260, 242, 252; 338/210–219, 296, 298, 300, 302, 334

[56] References Cited
UNITED STATES PATENTS

| | | | |
|---|---|---|---|
| 2,016,303 | 10/1935 | Sprague | 333/79 |
| 2,884,605 | 4/1959 | Dubilier | 333/79 |
| 3,443,311 | 5/1969 | Worobey | 333/70 CR X |
| 3,483,453 | 12/1969 | Meyers | 317/260 |
| 3,786,322 | 1/1974 | Brown et al. | 317/256 |
| 3,859,592 | 1/1975 | Kessler | 317/256 X |

FOREIGN PATENTS OR APPLICATIONS

743,717  1/1956  United Kingdom ............ 333/70 CR

Primary Examiner—Alfred E. Smith
Assistant Examiner—Marvin Nussbaum
Attorney, Agent, or Firm—E. W. Pfeifle; D. J. Kirk

[57] ABSTRACT

A windable resistance-capacitance (R-C) network having at least three terminals and formed of adjacent first and second alternating layers of dielectric and electrically conductive low-resistance material is disclosed, in which discrete resistance and capacitance network elements of predetermined value are interconnected and formed by removing portions of the layers of conductive material along appropriately positioned lines. The present network can be economically mass produced and the formed resistance and capacitance elements exhibit a minimal distributive effect.

17 Claims, 13 Drawing Figures

RESISTANCE-CAPACITANCE NETWORK

BACKGROUND OF THE INVENTION

1. Field of the Invention

This invention relates to a resistance-capacitance (R-C) network, and more particularly, to an R-C network comprising first and second layers of both dielectric and low-resistance electrically conductive material arranged face-to-face adjacent each other in an alternating sequence, and having at least three terminals.

2. Descripton of the Prior Art

Rolled type capacitors composed of two dielectric strips each bearing a metallized coating on one side thereof, which coatings can be continuous or machined into various configurations of interconnected sectional areas, and arranged alternately one above the other before being wound about a common axis, are known. See, for example, U.S. Pat. No. 2,216,558, issued to A. Ortlieb on Oct. 1, 1940, and U.S. Pat. Nos. 2,683,792 and 2,716,180, issued to W. Dubilier on July 13, 1954 and Aug. 23, 1955, respectively. These capacitors have been used individually in circuits or in combination with discrete resistor and/or inductor elements to form a network.

In more recent years, the miniaturization of both circuits and devices, such as, for example, relay coils, has created an interest in also fabricating various R-C networks which have a minimal physical size to enable the networks to, inter alia, be connected between closely spaced terminals and/or with devices mounted within metal containers or cans for shielding purposes. One solution to miniaturizing an R-C network is disclosed in U.S. Pat. No. 3,443,311, issued to W. Worobey on May 13, 1969. There, a thin film distributed R-C network is formed by depositing a layer of a film-forming metal of the type whose oxides are known to be excellent dielectric materials on a cleansed substrate by condensation techniques, anodizing the deposited film-forming metal surface to form an anodic oxide layer, depositing a layer of low-density tantalum upon the oxide layer, and generating a desired resistor pattern in the low-density tantalum layer by conventional photoengraving techniques.

Another solution to miniaturizing R-C networks is found in U.S. Pat. No. 3,786,322, issued to D. R. Brown et al. on Jan. 15, 1974, where the broad concept of using a rolled type capacitor to produce the R-C network was disclosed. There, two strips of dielectric material having a contiguous layer of metal on one side thereof are wound while each metallic layer is machined, preferably by a laser beam, to form an elongated conductive path extending back land forth lengthwise along the associated strip in a serpentine fashion so that is comes to exhibit a resistance value of R between its ends. A separate electrical contact is made with only one end of each conductive path at opposed edges of the two strips to produce a two-terminal R-C network.

Design problems are, however, encountered where more complex R-C networks are to be fabricated, such as those networks which include three or more terminals or a plurality of resistors or capacitors on one or more of the metallized layers. U.S. Pat. 3,859,592, issued to H. Kessler on Jan. 7, 1975 provides one solution for overcoming the above-mentioned problems. There, electrical R-C elements are formed of two or more insulating foils and layers of electrically conductive materials arranged alternately to form a stack wherein at least one of the layers of conductive materials is a high resistance layer for forming the resistive elements, and alternate layers are staggered with respect to one another. Various configurations of R-C elements, having two or more connections thereto, are disclosed as possible by providing incisions in the stack and by the proper selection of the stacked layers and the number and length of incisions into the formed stack.

The problem, therefore, still remains of providing R-C networks comprising three or more terminals which only use the more economical low-resistance layers, and which can be economically mass produced without first forming a stack of layered insulating and electrically conductive foils where the stack arrangement is dependent on the desired R-C network configuration, and then attempting to maintain the stack orientation during the winding process after incisions have been made therein. An additional problem with the prior art is the need to fabricate a wound R-C network in which it is possible to control and minimize the distributed capacitance in the network elements.

BRIEF SUMMARY OF THE INVENTION

The present invention relates to a resistance-capacitance network, and more particularly, to an R-C network comprising first and second layers of both dielectric and low-resistance electrically conductive material arranged face-to-face adjacent each other in an alternating sequence, and having at least three terminals.

The invention further relates to an R-C network comprising first and second layers of both dielectric and low-resistance electrically conductive material arranged face-to-face adjacent each other in an alternating sequence, where each of the layers of electrically conductive material defines a separate conductive path and one of the paths comprises alternate sections of the associated layer of conductive material and resistive patterns formed in the layer. The sections of the one layer of conductive material are capactively coupled to corresponding sections on the other layer of conductive material to form discrete capacitors. A separate electrical connection is made to the first section of the first layer of conductive material forming one plate of a first capacitor, to a section of the first or second layer of conductive material forming another capacitor, and to the second layer of conductive material, to provide at least three external connections to the formed R-C network.

Other and further aspects of the present invention will become apparent during the course of the following description and by reference to the accompanying drawings and the appended claims.

BRIEF DESCRIPTION OF THE DRAWINGS

Referring now to the drawings, in which like numerals represent like parts in the several views.

DESCRIPTION OF THE PREFERRED EMBODIMENTS

The R-C network of the present invention, as shown, for example, in FIGS. 1, 3, 5, 6, 7, and 9, includes two network forming strips 12 and 14, the strip 12 including a sheet of dielectric material 16 having a contiguous and conductive metallic layer 18 on one side thereof, and the strip 14 including a sheet of dielectric material 22 having a contiguous and conductive metallic layer 24 on one side thereof. The dielectric sheets 16 and 22 may be formed of any flexible dielectric material such as, for example, paper or a plastic such as polycarbonate, polystyrene or polyester sold under the trademark "Mylar", owned by E. I. DuPont de Nemours and Co.

The metallic layers 18 and 24 may be formed of any low resistance conductive material such as, for example, aluminum, silver, zinc or alloys thereof having a surface resistance, for example, on the order of magnitude of $1\Omega$/square. Preferably, the conductive metallic layers 18 and 24 are positioned contiguous to their respective sheets of dielectric material by coating one side of the sheets using, for example, metal vapor deposition or sputtering techniques, and are considered as being so positioned in the description of the invention. The metallic layers 18 and 24 may, however, also comprise a strip of metallic foil positioned contiguous to the respective sheets of dielectric material without the surfaces being bonded together. The desired resistance and capacitance values are formed by removing portions of the metallic layers along straight, and appropriately spaced, lines.

Figures 1, 2:
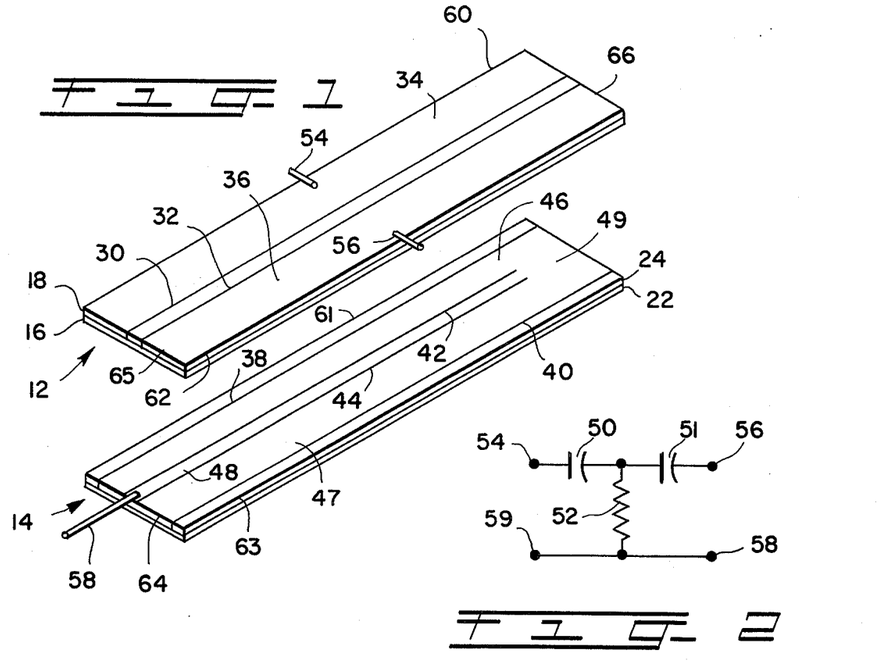
FIG. 1 illustrates the configuration of conductive paths on each of two sheets of dielectric material employed in fabricating an R-C network in accordance with the present invention.
FIG. 2 is an electrical equivalent circuit diagram of the network shown in FIG. 1.

Referring now to the drawings, FIGS. 1 and 2 illustrate an R-C network which can be produced in a manner similar to that of a wound capacitor. There, a first metallic layer 18, on dielectric sheet 16, is machined to remove portions of the metallic layer 18 along two parallel lines 30 and 32 running lengthwise along metallic layer 18 so as to, in effect, make two narrow cuts extending entirely through metallic layer 18 and separate the layer into two sections 34 and 36. A second metallic layer 24, on dielectric sheet 22, is machined to remove portions of metallic layer 24 along two parallel lines 38 and 40 running lengthwise adjacent the opposed sides 61 and 63 of metallic layer 24, and along two parallel lines 42 and 44 and positioned relatively close together between lines 38 and 40 and extending nearly the entire length of layer 24. The section 46 of metallic layer 24, between lines 38 and 42, is capacitively coupled to a corresponding area of section 34 of metallic layer 18 to form a first capacitor 50. The section 47 of metallic layer 24, between lines 40 and 44, is capacitively coupled to a corresponding area of section 36 on metallic layer 18 to form a second capacitor 51. The section 48 of metallic layer 24, between lines 42 and 44, forms a resistor 52 electrically connected to a common junction 49 between sections 46 and 47.

To enable the formed R-C network of FIG. 1 to be interconnected to external devices or circuits, electric conductors 54 and 56 are terminated on sections 34 and 36, respectively, preferably on opposed sides 60 and 62 of metallic layer 18, and an electric conductor 58 is terminated on section 48 between lines 42 and 44 near the end 64 of metallic layer 18. In this manner the equivalent circuit of FIG. 2 is formed between conductors 54, 56 and 58. Where a fourth terminal 59, as shown in FIG. 2, is required in the formed network, a separate external connection can be made to conductor 58. In the preferred embodiments herein described, conductors 54, 56 and 58 can be attached to the network in any known manner to provide the appropriate connections. For example, conductors 54 and 56 can be attached directly to metallic layer 18, or after network forming strips 12 and 14 are overlapped and wound together in a tight coil, solder can be sprayed to cover the exposed edges 60–63 of forming strips 12 and 14 and thereby contact metallic layers 18 and 24. Conductors 54 and 56 can then be attached to the solder coatings, commonly called solder blocks.

When forming strips 12 and 14 are overlapped or wound together, the capacitance of each of capacitors 50 and 51 is determined by the surface area of each of sections 46 and 47 of metallic layer 24, respectively, the capacitance increasing as the surface area of a section increases. Similarly, the resistance of resistor 52 is determined by the width and length of section 48 which is dependent on the distance between lines 42 and 44, a decrease in distance between lines 42 and 44 causing a corresponding increase in resistance. To form capacitors 50 and 51 and resistor 52, and thereby provide a minimal distributive capacitance effect in resistor 52, lines 30 and 32 on layer 18 are preferably positioned to overlie lines 42 and 44 of layer 24. Lines 38 and 40 in metallic layer 24 function to prevent a possible short circuit between conductors 54 and 56 and the nearby sections 46 and 47 on layer 24, respectively, when forming strips 12 and 14 are overlapped or wound together and a solder block is used. If the edge 60 of forming strip 12 is slightly offset from the edge 61 of forming strip 14 such that edge 60 overlies line 38 on metallic layer 24, then line 40 is not required since a possiblility for a short circuit between conductor 56 and the edge 63 of metallic layer 24 has been essentially eliminated. Similarly, if the edge 62 of forming strip 12 is offset to overlie line 40 on metallic layer 24, then line 38 is not required.

Figures 3, 4:
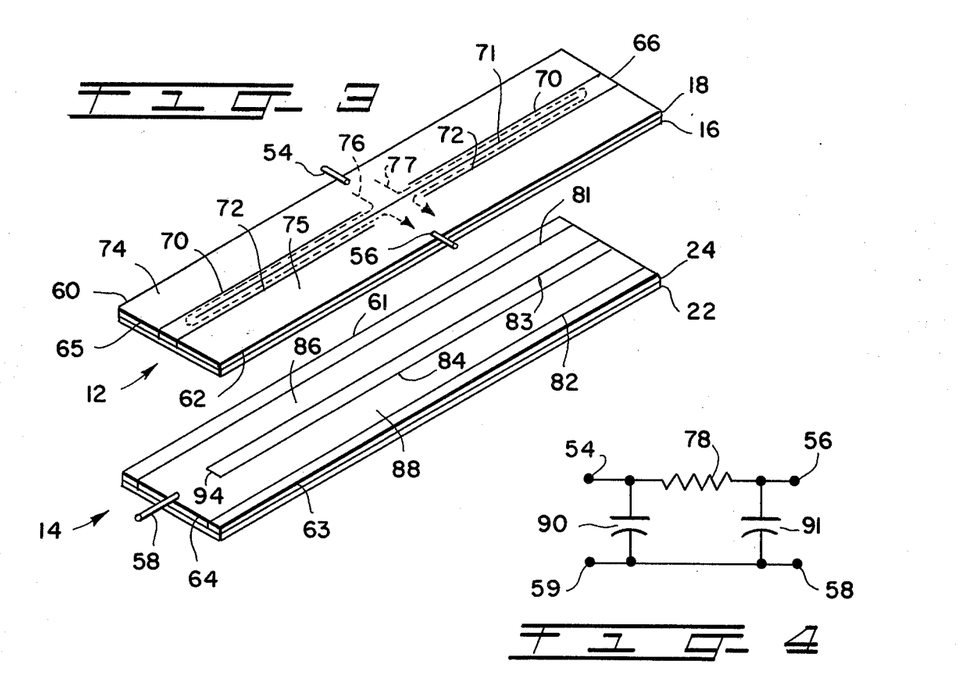
FIG. 3 is a view similar to FIG. 1 illustrating another exemplary embodiment of the present invention.
FIG. 4 is an electrical equivalent circuit diagram of the networks shown in FIGS. 3 and 6.

In a second preferred embodiment of the present invention as shown in FIG. 3, an R-C network is formed in a manner similar to that shown in FIG. 1 but having a circuit configuration equivalent to that shown in FIG. 4. In FIG. 3, metallic layer 18 is machined to remove portions of the layer along closely spaced parallel lines 70, 71 and 72 running lengthwise near the center of layer 18 to effectively separate layer 18 into two sections 74 and 75. Lines 70 and 72 extend lengthwise between the two opposed ends 65 and 66 of layer 18 with a discontinuity in the middle thereof to electrically interconnect the space between lines 70 and 72 with sections 74 and 75. Line 71, however, runs lengthwise between lines 70 and 72 without a discontinuity but terminates short of each of the opposed ends 65 and 66 of metallic layer 18 to form two serpentine paths 76 and 77 between sections 74 and 75. Serpentine paths 76 and 77 provide the equivalent of two resistors connected in parallel having a combined resistance value of R and shown as a single resistor 78 in the equivalent circuit of FIG. 4.

Figure 5:
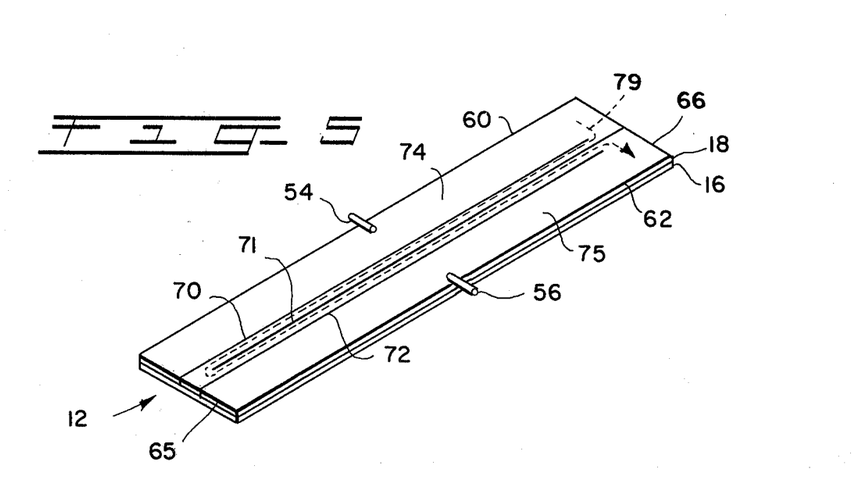
FIG. 5 illustrates another arrangement of forming strip 12 shown in FIG. 3.

Alternative arrangement for machining the metallic layer 18 of FIG. 3, and still form the equivalent circuit of FIG. 4, is shown in FIG. 5. There lines 70 and 72 are machined lengthwise from one end 65 of metallic layer 18 and terminate short of the other end 66, while line 71 begins at the other end 66 of metallic layer 18 and terminates short of the one end 65. The arrangement of lines 70, 71 and 72 forms a serpentine path 79 having a resistance value of R which is shown as resistor 78 in FIG. 4.

Metallic layer 24 in FIG. 3 can be machined to remove portions of the layer along two parallel lines 81 and 82 running lengthwise adjacent the opposed sides 61 and 63 of layer 24, and along two parallel lines 83 and 84 positioned to underlie lines 70 and 72 on layer 18 when forming strips 12 and 14 are overlapped or wound together. Lines 83 and 84, when included, do not however extend the full length of metallic layer 24 but terminate short of one end of metallic layer 24 to provide a common electrical connection between sections 86 and 88 of metallic layer 24 formed between lines 81 and 83, and 82 and 84, respectively.

Sections 86 and 88 of metallic layer 24 are capacitively coupled to sections 74 and 75, respectively, on metallic layer 18 to form respective capacitors 90 and 91 shown in the equivalent circuit diagram of FIG. 4. Lines 83 and 84 tend to reduce the distributive effect of the network elements for the same reasons expressed above with regard to lines 30 and 32 and shown in FIG. 1, especially when the open ends of lines 83 and 84 are connected by a line 94.

Electrical conductors 54 and 56 are terminated on sections 74 and 75, respectively, of metallic layer 18, and electrical conductor 58 is terminated on the conductive path interconnecting sections 86 and 88 of metallic layer 24, to provide external connections to the formed R-C network. A separate external connection to conductor 58 can be made where a fourth connection 59, as shown in FIG. 4, is required to the R-C network.

Lines 81 and 82 function, similar to lines 38 and 40 of FIG. 1, to substantially prevent a short circuit from occurring between conductors 54 and 56 and sections 86 and 88 of metallic layer 24, respectively, when forming strips 12 and 14 are overlapped and wound together. If edge 60 of forming strip 12 is slightly offset from edge 61 of forming strip 14 such that edge 60 overlies line 81 on metallic layer 38, then line 82 is not required, since the offset will prevent a short circuit from occurring between conductor 56 and edge 63 of metallic layer 24 if a solder block is used. Similarly, if the edge 62 of forming strip 12 is offset to overlie line 82 on metallic layer 24, then line 81 is not required.

Figure 6:
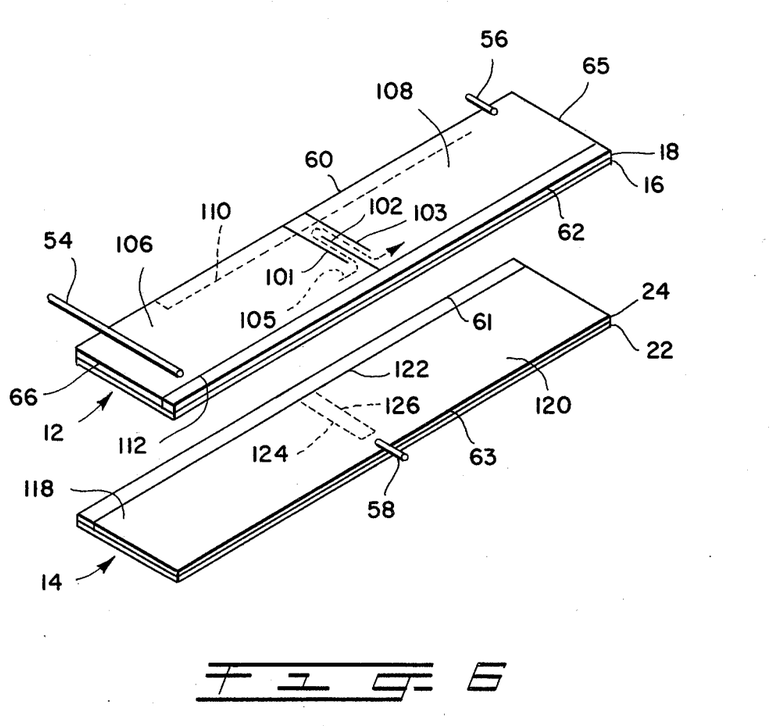
FIG. 6 is a view similar to FIG. 1 illustrating still another exemplary embodiment of the present invention.

An arrangement according to a third preferred embodiment of the present invention is shown in FIG. 6, the arrangement providing an R-C network also having the equivalent circuit shown in FIG. 4. There, metallic layer 18 is machined to remove portions of the layer along closely spaced parallel lines 101, 102, and 103, each line extending partially across a central portion of metallic layer 18 to form a resistive path 105 having a serpentine configuration, resistive path 105 forming the resistor 78 shown in the equivalent circuit diagram of FIG. 4. Lines 101 to 103 also divide metallic layer 18 into two sections 106 and 108, each section electrically connected to a separate end of resistive path 105. Electrical conductors 54 and 56 are connected to sections 106 and 108, respectively, to provide a series conductive path which includes conductor 54, section 106, resistive path 105, section 108, and conductor 56. Conductor 54 can be placed and connected across section 106 near end 66 of metallic layer 18, as shown in FIG. 6, to provide an arbor for winding forming strips 12 and 14 together. A portion of metallic layer 18 is also removed along a line 112 running parallel and adjacent to edge 62 to prevent an electrical short circuit when forming strips 12 and 14 are wound together and a solder block is sprayed over edges 62 and 63 of metallic layers 18 and 24, respectively. A portion of metallic layer 18 can also be removed along a line 110 (shown in phantom in FIGS. 6 and 7) to provide the necessary isolation between conductors 54 and 56 when a solder block is sprayed on edges 60 and 61 of the wound network in the area encompassed by line 110 and conductor 56. When line 110 is included, then lines 101 and 103 would only extend to intersect line 110 and not edge 60.

Sections 106 and 108 of metallic layer 18 are capacitively coupled to corresponding sections 118 and 120, respectively, on metallic layer 24 to form the capacitors 90 and 91 shown in FIG. 4. A conductor 58 terminated on layer 24 adjacent edge 63 provides a third external connection 58 (and a fourth connection 59 when required) to the formed R-C network.

Metallic layer 24 is machined to remove a portion of the layer along line 122 running lengthwise adjacent edge 61 to prevent an electrical short circuit between metallic layer 18 and sections 118 and 120 of metallic layer 24 when a solder block is sprayed on edges 60 and 61 to connect conductor 56. Portion of layer 24 can also be removed along lines 124 and 126 (shown in phantom) underlying lines 101 and 103 on metallic layer 18 to reduce the distributed capacitance effect of the formed resistor element.

Figures 7, 8:
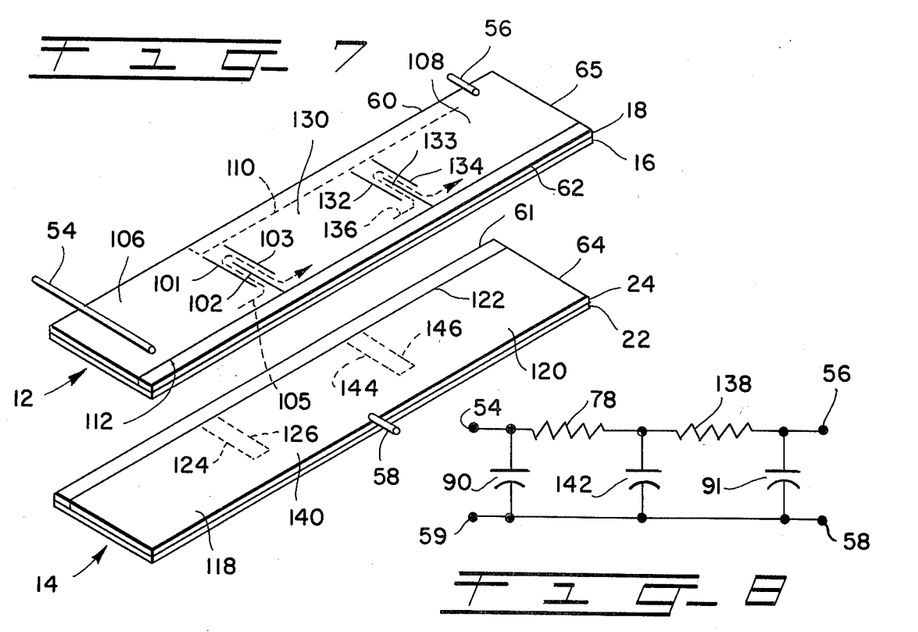
FIG. 7 is a view similar to FIG. 1 illustrating an extension of the R-C network of FIG. 6.
FIG. 8 is an electrical equivalent circuit diagram of the network shown in FIG. 7.

The R-C network illustrated in FIG. 7 includes the configuration of the R-C network illustrated in FIG. 6 and has the equivalent circuit diagram shown in FIG. 8. In FIG. 7, forming strips 12 and 14 are lengthened from that shown in FIG. 6 to include a section 130 and closely spaced parallel lines 132, 133 and 134 between line 103 and section 108 on metallic layer 18. Lines 132 to 134 are machined similar to lines 101 and 103 to form a resistive path 136 having a serpentine configuration. A series conductive path is, therefore, formed on metallic layer 18 which includes conductor 54, section 106, resistive path 105, section 130, resistive path 136, section 108, and conductor 56. Resistive path 136 forms the resistor 138 shown in FIG. 8 while section 130 is capacitively coupled to a corresponding section 140 on adjacent metallic layer 24 to form the capacitor 142 of FIG. 8. Lines 144 and 146 can be machined in layer 24 to underlie lines 132 and 134 in metallic layer 18 and reduce the distributed capacitance effect in the formed resistor 138 in a manner similar to lines 124 and 126.

Figures 9, 10:
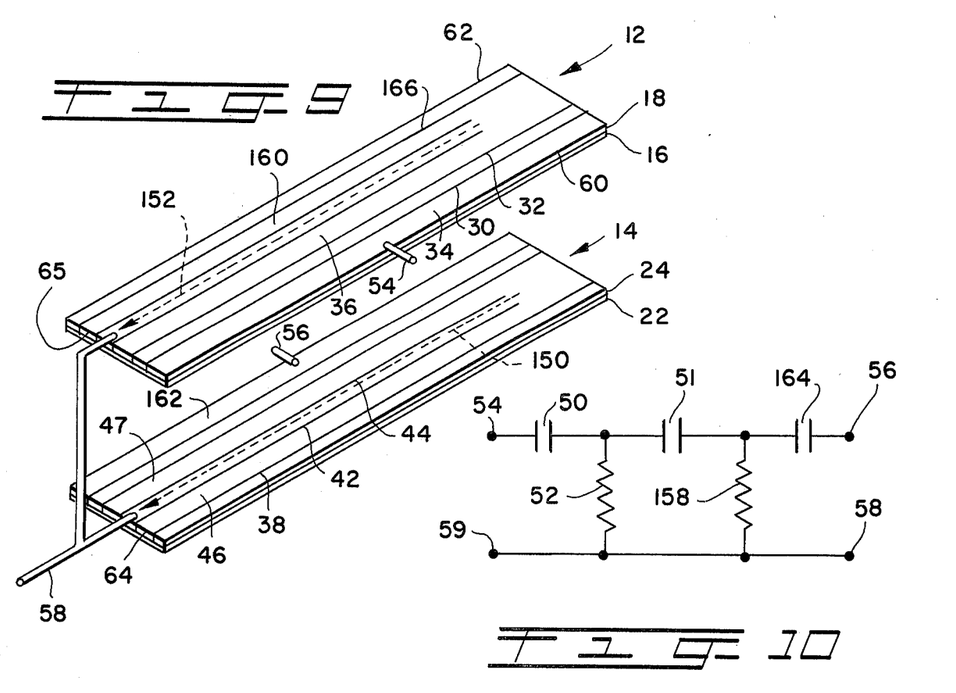
FIG. 9 is a view similar to FIG. 1 illustrating an extension of the R-C network shown in FIG. 1.
FIG. 10 is an electrical equivalent circuit diagram for the network shown in FIG. 9.

It is, of course, possible to add further elements to the R-C networks of FIGS. 1, 3, and 7 in a manner similar to that shown in FIG. 7 for expanding the R-C network of FIG. 6. A typical expansion for the R-C network of FIG. 1 is shown in FIGS. 9 and 10. There, the ends of resistive paths 150 and 152 are interconnected to external connection 58 to produce the equivalent circuit of FIG. 10. Such interconnection can be accomplished with discrete leads from each of the resistive paths 150 and 152, or by any other known means. Resistive paths 150 and 152 form the resistances 52 and 158, respectively, shown in FIG. 10, while sections 34 and 46, 36 and 47, and 160 and 162 form the capacitors 50, 51 and 164, respectively, shown in FIG. 10. Line 40 in metallic layer 24 of FIG. 1 has been eliminated and line 166 in metallic layer 18 of FIG. 9 has been substituted therefor, since conductor 56 is terminated on metallic layer 24 in FIG. 9 instead of on metallic layer 18 as shown in FIG. 1.

Figure 11:
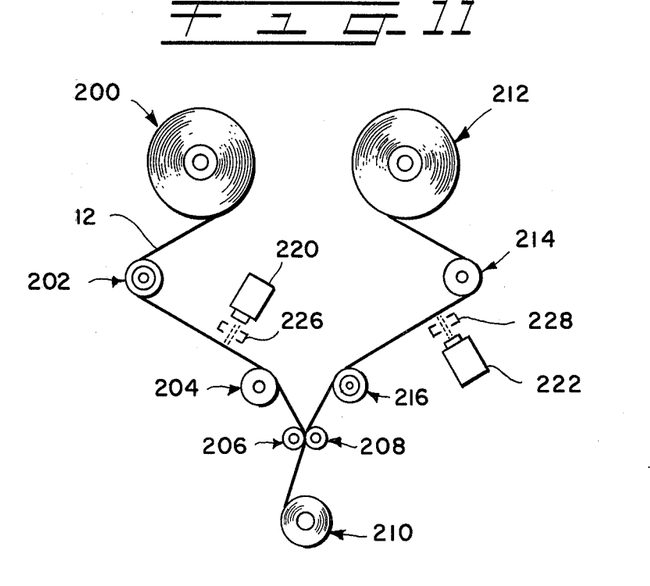
FIG. 11 is a partial front view of an exemplary apparatus for fabricating R-C networks in accordance with the present invention.

To form a network roll, lengths of the network forming strips 12 and 14 are convoluted, or wound together, with an apparatus of the type shown in FIG. 11. A supply of the network forming strip 12, not having any portions of the metal layer thereof removed, is maintained on a rotatable reel 200 and extends from the reel around a guide roller 202, around a nonconductive guide roller 204, between two nonconductive guide rollers 206 and 208, and to an arbor 210. Similarly, a supply of the network forming strip 14, also not having any portions of the metal layer thereof removed, is maintained on a rotatable reel 212 and extends from the reel around a nonconductive guide roller 214, around a guide roller 216, between the two guide rollers 206 and 208, and to the arbor 210. At the arbor 210, which winds, or convolutes, the network forming strips 12 and 14 together to form a network roll, the strips are overlapped with the dielectric material of one of the strips positioned between the metal layer of that strip and the metal layer of the other strip to electrically isolate the two metal layers 18 and 24, as electrical contact between the metal layer of one of the strips and the metal layer of the other strip would destroy the usefulness of the network. To insure against accidental electrical contact between the two metal layers 18 and 24 and to facilitate, as was explained hereinbefore, an electrical connection with the metallic layer of the network forming strips, the overlapped network forming strips 12 and 14 can be slightly offset with respect to each other. To remove portions of the metallic layer along lanes or lines extending lengthwise or crosswise in strips 12 and 14, a metal removing device 220 associated with the network forming strip 12, and a metal removing device 222 associated with the network forming strip 14, which devices may be either lasers or electron discharge devices having sufficient power to cut through and remove portions of the metallic layer, are each positioned to project one or more narrow energy beams onto the metallic layer of their associated strip. Alternatively, the devices 220 and 222, may be mechanical cutters, each positioned to sever, or remove metal from, its associated metallic layer along one or more lines. As the network forming strips are wound together on the arbor 210 and advanced past the metal removing devices 220 and 222, the devices remove metal therefrom to form one or more lines of removed metal in each of the metallic layers. Each of the devices 220 and 222 may be a plurality of laser or electron discharge devices, or a plurality of mechanical cutters, which are individually actuable to remove metal from the metallic layers along lines having a selected configuration. Where devices 220 and 222 are lasers, deflection systems 226 and 228 (shown in phantom) are required to remove portions of the metal from metallic layers 18 and 24 along a selected pattern.

Figures 12, 13:
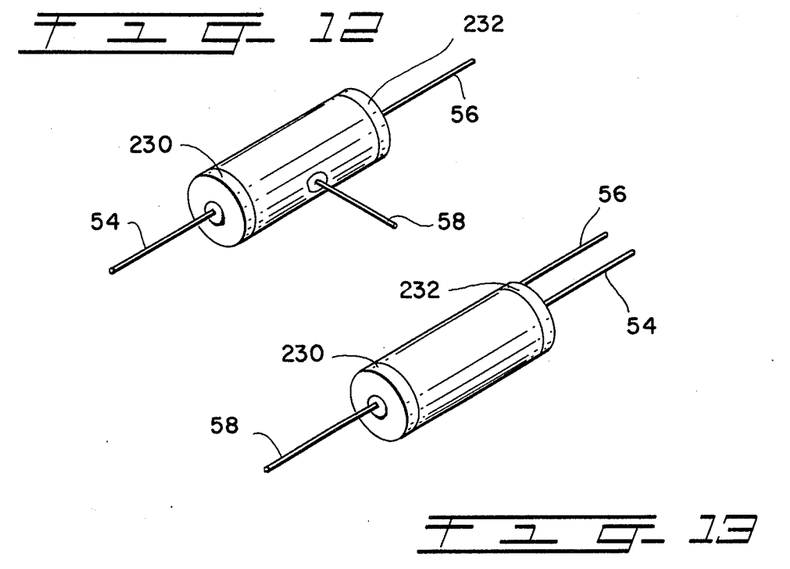
FIG. 12 is a perspective view of a wound R-C network fabricated as shown in FIGS. 1 and 3 having electrical connections made therewith.
FIG. 13 is a perspective view of a wound R-C network fabricated as shown in FIGS. 6 and 7 having electrical connections made therewith.

Although it is possible to attached discrete conductors as the network is wound, it is also possible, after the network roll has been wound on arbor 210, to provide at least one electrical connection to each edge of at least one of the metallic layers 18 and 24 by means of conventional solder blocks 230 and 232, as shown in FIGS. 12 and 13.

Solder blocks 230 and 232 each electrically engage a lengthwise edge of one of the network forming strips 12 and 14 and in turn the appropriate metallic layers 18 and 24, respectively. The appropriate conductor can then be attached to the associated solder blocks 230 and 232. The solder blocks may be sprayed, in the molten state, onto each of the network ends by conventional solder spraying apparatus (not shown). In FIG. 13, solder block 232 will be washer shaped to prevent an electrical short circuit between solder block 232 and either one of conductor 54, section 106 (FIGS. 6 and 7), and section 130 (FIG. 7).

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A network including discrete resistance and capacitance elements connected in a series-parallel relationship, the network comprising:

first and second layers of dielectric material and first and second layers of low-resistance electrically conductive material, said layers of dielectric material and layers of conductive material being arranged face-to-face adjacent to each other in alternating sequence, said first and second layers of conductive material defining a first and a second conductive path, respectively, one of said conductive paths comprising discrete alternate sections of the associated layer of conductive material and a discrete resistive element pattern formed in said associated layer of conductive material, each section being capacitively coupled to an adjacent corresponding discrete section of the other layer of conductive material to form a discrete capacitor element;

first means electrically connected to the first section of said first layer of conductive material, said first section forming one plate of a first capacitor element;

second means electrically connected to a section of one of said first and second layers of conductive material, which section forms one plate of another capacitor element, to complete the series path of said series-parallel relationship; and third means electrically connected to said second layer of conductive material to connect to the elements on said second layer to complete said series-parallel resistance-capacitance network.

2. A resistance-capacitance network according to claim 1, wherein the adjacent first and second alternate layers of dielectric and low-resistance electrically conductive material are convoluted to form a wound resistance-capacitance network.

3. A resistance-capacitance network according to claim 1, wherein:
said one conductive path comprises first and second sections and is said second conductive path formed in said second layer of conductive material, the resistive pattern comprising part of said one conductive path being connected at one end to a common electrical connection between said first and second sections; and
said third means is terminated on the other end of the resistive path on said second layer of conductive material.

4. A resistance-capacitance network according to claim 3, wherein:
said second means is terminated on the second section forming part of the first conductive path on said first layer of conductive material.

5. A resistance-capacitance network according to claim 3, wherein:
portions of said first layer of conductive material are removed along closely spaced parallel lines which overlie said resistive pattern on said second layer of conductive material, thereby to electrically isolate from each other the first and second sections of said first conductive path.

6. A resistance-capacitance network according to claim 3, wherein:
said first conductive path further comprises a third section of said first layer of conductive material and a second resistive pattern positioned between said second and third sections, the second resistive pattern being connected at one end to a common electrical connection between said second and third sections and at the other end to said third means, and said third section being capacitively coupled to a corresponding third section formed in said second layer of conductive material to form a third capacitor; and
the second means is terminated on the third section forming part of the second conductive path on said second layer of conductive material.

7. A resistance-capacitance network according to claim 6, wherein:
portions of said first layer of conductive material are removed along closely spaced parallel lines which overlie the first resistive pattern, thereby to electrically isolate from each other the first and second sections of said first conductive path; and
portions of said second layer of conductive material are removed along closely spaced parallel lines which underlie the second resistive pattern, thereby to electrically isolate from each other the second and third sections of said second conductive path.

8. A resistance-capacitance network according to claim 1, wherein:
said one conductive path is said first conductive path formed in said first layer of conductive material, the first conductive path having said first section, resistive pattern, and second section connected in series; and
the third means is connected to a common electrical connection between said first and second sections of said second conductive path.

9. A resistance-capacitance network according to claim 8, wherein:
the second means is terminated on the second section of said first layer of conductive material.

10. A resistance-capacitance network according to claim 8, wherein:
portions of said first layer of conductive material are removed along closely spaced parallel lines running lengthwise in said first layer of conductive material, to form said resistive pattern at least one resistive path having a serpentine configuration.

11. A resistance-capacitance network according to claim 10, wherein:
the resistive pattern comprises first and second resistive paths forming first and second resistors, respectively, said resistive paths being connected in parallel with one another to provide a combined resistance value equal to R.

12. A resistance-capacitance network according to claim 8, wherein:
portions of the first layer of conductive material are removed along closely spaced parallel lines running crosswise in said first layer of conductive material to form the resistive pattern constituting a path having a serpentine configuration.

13. A resistance-capacitance network according to claim 12, wherein:
portions of the second layer of conductive material are removed along closely spaced parallel lines which partially underlie the resistive pattern on said first layer of conductive material to substantially reduce the distributed capacitance between the first and second layers of conductive materials.

14. A resistance-capacitance network according to claim 9, wherein:
the first conductive path further comprises a third section of said first layer of conductive material and a second resistive pattern positioned both between the first resistive pattern and the second section, said third section being capacitively coupled to a corresponding third section on said second layer of conductive material to form a third capacitor and said first conductive path comprises said first section, the first resistive path, the third section, the second resistive path, and the second section connected in series between said first and second means; and
the third means is connected to a common electrical connection between said first, second, and third sections on the second layer of conductive material.

15. In a resistance-capacitance network;
first and second interleaved and convoluted strips of insulating materials;
a first layer of electrically conductive material on a first surface of said first insulating strip, portions of the first layer of conductive material being removed along closely spaced parallel lines extending for nearly the entire length of said first layer of conductive material from one end thereof and positioned near the center of said first layer;
a second layer of electrically conductive material on a first surface of said second insulating strip, portions of the first layer of conductive material being removed along closely spaced parallel lines which extend for the entire length of said second layer of conductive material to overlie the parallel lines formed in said first layer of conductive material and separate said second layer of conductive material into first and second sections;

first means for electrically contacting only the first section on said second layer of conductive material;

second means for electrically contacting only the second section on said second layer of conductive material; and third means for electrically contacting only said first layer of conductive material near the end thereof and between said closely spaced parallel lines.

16. In a resistance-capacitance network:

first and second interleaved and convoluted strips of insulating material;

a first layer of electrically conductive material on a first surface of said first strip of insulating material, portions of said first layer of conductive material being removed along at least three closely spaced parallel lines to both form a resistive path having a serpentine configuration and divide said first layer of conductive material into a first and a second section, each section being connected to a separate end of said resistive path;

a second layer of electrically conductive material on a first surface of said second strip of insulating material;

first means for electrically contacting only the first section of said first layer of conductive material;

second means for electrically contacting only the second section of said first layer of conductive material; and third means for electrically contacting the second layer of conductive material.

17. In a resistance-capacitance network:

first and second interleaved and convoluted strips of insulating material;

a first layer of electrically conductive material on a first surface of the first strip of insulating material, portions of said first layer of conductive material being removed along a plurality of sets of at least three parallel lines to form a similar plurality of resistive paths having a serpentine configuration which divide said first layer of conductive material into a similar plurality plus one of alternate sections thereof, the first layer of conductive material forming a conductive path comprising alternate sections of said first layer of conductive material and said resistive paths connected in series;

a second layer of electrically conductive material on a first surface of said second strip of insulating material;

first means for electrically contacting only the first section of said first layer of conductive material in said serial conductive path;

second means for electrically contacting only the last section of said first layer of conductive material in said serial conductive path; and third means for electrically contacting said second layer of conductive material.

* * * * *